United States Patent [19]

Maniero et al.

[11] Patent Number: 5,920,191
[45] Date of Patent: Jul. 6, 1999

[54] CURRENT FLOW MONITOR FOR HEATING CABLES

[75] Inventors: Daniel A. Maniero, Mokena, Ill.; Victor V. Aromin, West Warwick, R.I.

[73] Assignee: Wrap-On Company, Inc., Bedford Park, Ill.

[21] Appl. No.: 08/967,948

[22] Filed: Nov. 12, 1997

[51] Int. Cl.⁶ .................................................. G01R 19/14
[52] U.S. Cl. ..................... 324/133; 324/127; 324/556; 219/486; 340/640
[58] Field of Search ..................................... 324/127, 133, 324/508, 509, 522, 539, 543, 555, 556; 340/640, 654, 655, 664; 219/482, 483, 486, 487, 497; 361/57, 87

[56] References Cited

U.S. PATENT DOCUMENTS

| | | | |
|---|---|---|---|
| 2,592,959 | 4/1952 | Schofield | 606/119 |
| 2,592,989 | 4/1952 | Wilson | 340/655 |
| 2,625,643 | 1/1953 | Cordis | 219/535 |
| 3,588,861 | 6/1971 | Meyer | 340/655 |
| 3,744,046 | 7/1973 | Tamasi | 340/655 |
| 3,774,189 | 11/1973 | Brown | 340/655 |
| 3,851,149 | 11/1974 | Daley | 340/655 |
| 3,859,646 | 1/1975 | Schwellenbach | 340/664 |
| 3,863,150 | 1/1975 | Cebuliak et al. | 324/133 |
| 3,996,513 | 12/1976 | Butler | 324/127 |
| 4,052,664 | 10/1977 | Pohl | 324/133 |
| 4,066,870 | 1/1978 | Colten | 340/655 |
| 4,207,566 | 6/1980 | Gitlin et al. | 340/664 |
| 4,421,976 | 12/1983 | Jurek | 340/640 |
| 4,520,417 | 5/1985 | Frank | 361/65 |
| 4,539,562 | 9/1985 | Sanders | 340/640 |
| 4,558,310 | 12/1985 | McAllise | 324/127 |
| 4,583,086 | 4/1986 | Andrews et al. | 340/664 |
| 4,639,719 | 1/1987 | Pappano et al. | 340/655 |
| 4,728,898 | 3/1988 | Staley, Jr. | 324/133 |
| 4,810,859 | 3/1989 | Anabtawi et al. | 219/535 |
| 4,822,983 | 4/1989 | Bremner et al. | 361/65 |
| 4,875,152 | 10/1989 | Foster | 340/664 |
| 5,002,501 | 3/1991 | Tucker | 439/417 |
| 5,004,432 | 4/1991 | Tucker | 439/417 |
| 5,015,944 | 5/1991 | Bubash | 324/133 |
| 5,043,670 | 8/1991 | Isfeld et al. | 340/655 |
| 5,252,081 | 10/1993 | Hart | 439/98 |
| 5,340,964 | 8/1994 | Galloway et al. | 219/486 |
| 5,451,747 | 9/1995 | Sullivan et al. | 219/528 |

*Primary Examiner*—Diep Do
*Attorney, Agent, or Firm*—Brinks Hofer Gilson & Lione

[57] ABSTRACT

An apparatus for monitoring the current flow through a variable load such as various lengths of heater cables. The apparatus can detect a wide range of currents so that the size of the load can vary.

17 Claims, 3 Drawing Sheets

CURRENT FLOW MONITOR FOR HEATING CABLES

BACKGROUND OF THE INVENTION

This invention relates to a current flow monitor that indicates if current is flowing through a load, for example, a heating cable.

Heating cables are used to protect objects under freezing conditions. For example, it is known to wrap a heating cable around a pipe to protect the pipe from freezing during inclement weather. Depending on the length of the pipe, a cable of appropriate length is selected to adequately protect the pipe along its length. Heating cables are also used to protect other objects such as gutters from freezing. Again, depending on the physical characteristics of the object to be protected, a particular length of heating cables is selected.

Because heating cables are often difficult to inspect once they have been installed, it is difficult, if not impossible, to determine if the heating cable is operating properly. For example, the heating cable may not be operating properly because it may have become disconnected from the power source. Thus, it is usually not known whether the cable is operating properly until the object it was to protect such as a pipe or gutter, for example, freezes. Such a condition often causes serious damage to property and involves difficult and expensive repairs.

It is therefore desirable to provide a monitor for indicating that a load is drawing current. It is also desirable to provide a monitor that is remote from the load it is monitoring so that a determination that the load is drawing current can be easily made. It is also desirable to provide a plug-in monitor that can be used with existing types of heating cables to monitor the current flow through the cables.

In addition, because the load that needs to be monitored can be variable, for example, the load may range from one heating cable of a first length to a heating cable of a second length that is different from the first length, it is also desirable to provide a monitor that can detect a wide range of currents so that the same monitor can be used for variable loads.

SUMMARY OF THE INVENTION

According to a first aspect of the invention there is provided an apparatus for monitoring the operating condition of a load coupled to a power source. The apparatus includes a current sensor coupled between the power source and the load, the current sensor having an output, an amplifier having an input and an output, wherein the input is coupled to the output of the current sensor, the output of the amplifier provides a first signal when the current sensed by the current sensor ranges from an amperage less than a milliamp to an amperage greater than 10 amps and provides a second signal otherwise, and an indicator coupled to the output of the amplifier wherein the indicator provides an indication in response to the first signal output by the amplifier.

According to a second aspect of the invention there is provided an apparatus for monitoring the operating condition of a load coupled to a power source. The apparatus includes means for detecting current flow between the power source and the load, and means for triggering an indicator in response to current flow detected by the means for detecting current flow wherein the current flow ranges from an amperage less than a milliamp to an amperage greater than 10 amps.

DETAILED DESCRIPTION OF THE PRESENTLY PREFERRED EMBODIMENTS

Figure 1:
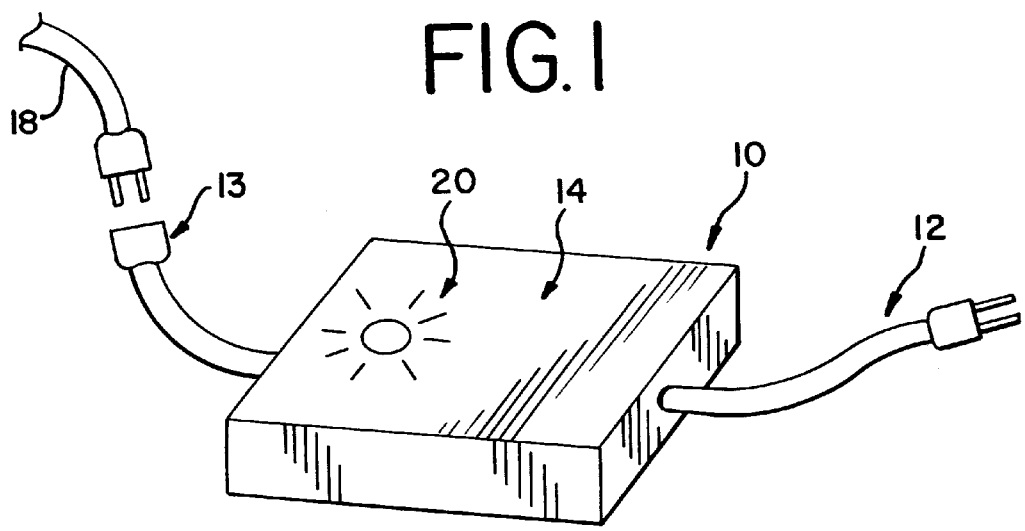
FIG. 1 is a schematic of a monitor according to a preferred embodiment of the present invention.

FIG. 1 is a schematic of a monitor 10 according to a preferred embodiment of the present invention. In a preferred embodiment the monitor 10 is a plug-in device which has a plug 12 at one end and a socket 13 at the other end. The monitor 10 can be plugged into a power source (not shown) either directly or through an extension cable (not shown) by plug 12. A heating cable 18 is plugged into the socket 13 of the monitor 10. Depending on where the heating cable is to be installed, an extension cord (not shown) can be used to couple the heating cable 18 to the monitor 10.

The circuitry of the monitor 10 is located in housing 14 which, in a preferred embodiment, is box-like. In a preferred embodiment the housing 14 is made of translucent plastic material.

The monitor 10 includes an indicator 20 which, in a preferred embodiment, is a visual indicator which provides a visual signal when the cable is operating properly, i.e., when current is flowing in the cable. In a preferred embodiment the indicator 20 is a neon glow lamp. Other types of indicators of course may be used such as a light emitting diode (LED) or a light bulb, for example. Alternatively, an indicator producing an audible signal may be used. In such a case, the audible signal would preferably be activated only when current is not flowing through the cable. By providing a monitor with an indicator that can be installed remotely from the load, it can be easily determined if the load is drawing current without having to make a physical inspection which may be difficult to do once the load has been installed.

Heating cables which can be coupled to the monitor 10 may be conventional cables. Suitable cables are made by Wrap-On Company of Bedford Park, Ill. which offers a wide variety of heating cables of various lengths. The cables are coupled to the monitor according to the present invention.

Figure 2:
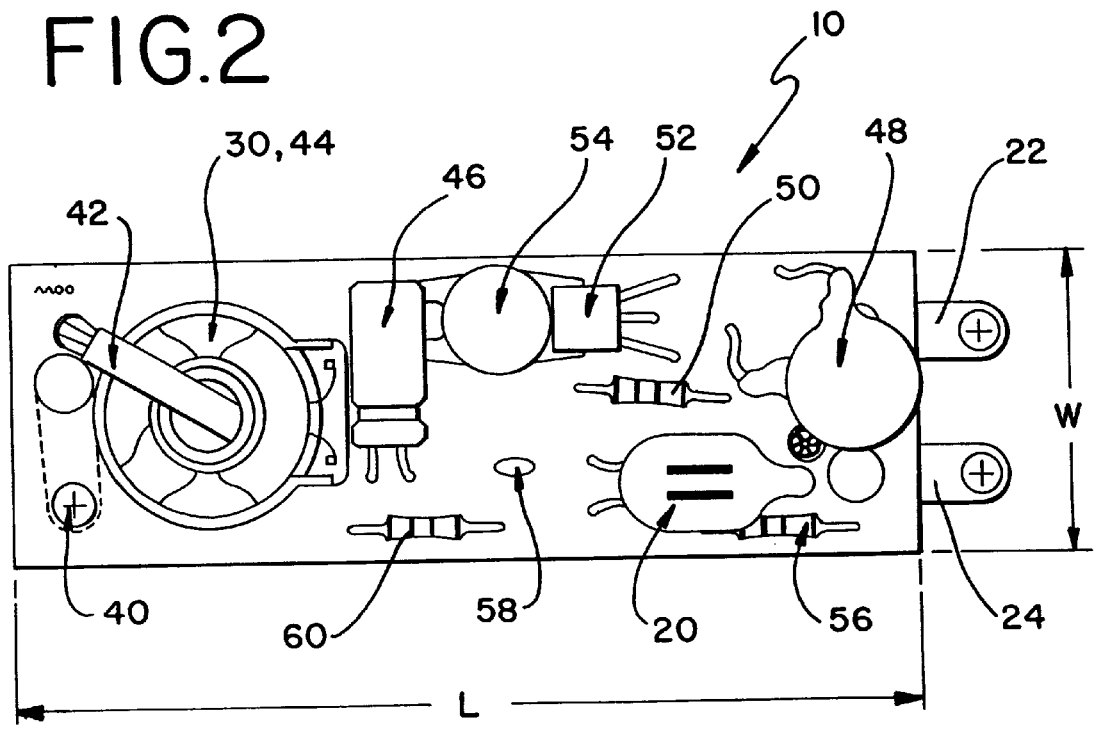
FIG. 2 is a top view of a monitor shown in FIG. 1 with the cover removed.

FIG. 2 is a top view of a monitor 10 shown in FIG. 1 with its cover removed to show the circuit elements of the monitor. Terminals 22 and 24 of the monitor 10 couple the neutral and live leads respectively of a power source (not shown) to the monitor 10 through plug 12. Located within the housing 14 is a circuit board on which the electronics which implement the monitor are mounted. The electronics of the monitor will be described in detail with reference to FIG. 3. Also located on the circuit board is an indicator 20 which, in this preferred embodiment is a neon glow lamp which preferably emits an orange color. Because the housing of the monitor 10 is made of a translucent plastic material, the glow of the glow lamp 20 can be seen through the housing. The other electronic components of the monitor can also be seen through the housing. The other components of the monitor circuitry will be described in detail with reference to FIG. 3, however, the components are labeled in FIG. 2.

In a preferred embodiment the monitor 10 has a length (l) of about 2.4 inches and a width (w) of about 0.80 inches. The thickness of the monitor 10 is about ⅝th inches. The present invention is not limited to the particular dimensions or layout of the electronics shown in the preferred embodiments.

Figure 3:
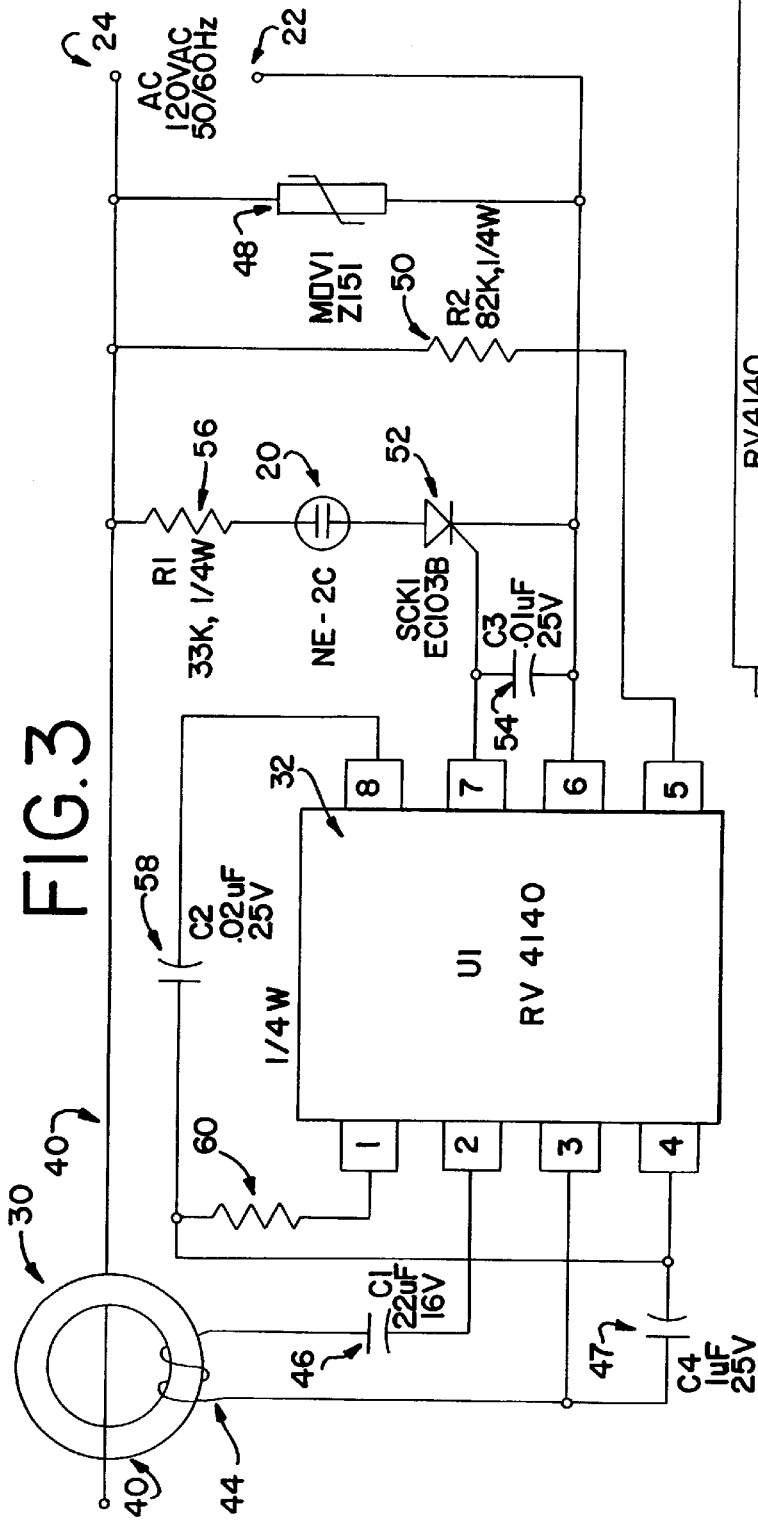
FIG. 3 is a schematic of the circuitry inside the monitors shown in FIGS. 1 and 2 according to a preferred embodiment of the present invention.
Figure 4:
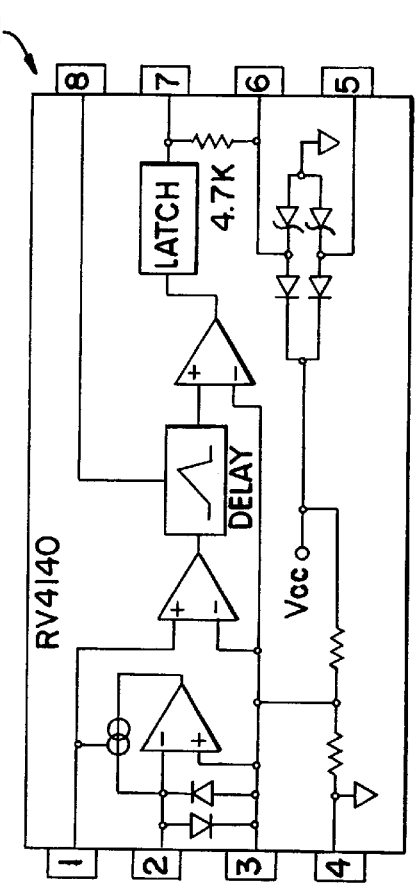
FIG. 4 is a functional block diagram of the amplifier/controller IC of the monitor circuitry shown in FIG. 3.

FIG. 3 is a schematic of the circuitry inside the monitor 10 shown in FIGS. 1 and 2 according to a preferred embodiment of the present invention. The circuitry includes a sensor 30, an amplifier/controller IC 32, and an indicator 20. The live terminal of a power source (not shown) is coupled to the monitor circuitry at terminal 24 and the neutral terminal of the power source is coupled to the monitor circuitry at terminal 22. A load (not shown) is coupled to the monitor circuitry at terminal 40. In a preferred embodiment the amplifier/controller IC 32 is a semiconductor device commercially available as model number RV4140 from the Raytheon Semiconductor Company of Mountain View, Calif. FIG. 4 is a functional block diagram of the amplifier 32 of the monitor circuitry shown in FIG. 3 supplied by Raytheon Semiconductor. The details of the amplifier's circuitry are available from Raytheon Semiconductor and need not be reproduced here.

The sensor 30 in a preferred embodiment is a current transformer having primary and secondary windings 42 and 44 respectively. The primary winding 42 is coupled in series between the power supply and the load. One end of the secondary winding 44 is coupled to pin 3 and to pin 4, preferably through a capacitor 47. The other end of the secondary winding 44 is coupled to pin 2 preferably through a capacitor 46. Pin 6 of the amplifier 32 is coupled to terminal 22 and is also coupled to terminal 24 preferably through a varistor 48. Pin 6 is also coupled to the cathode of a gate controlled rectifier 52 and to pin 7 through a capacitor 54. Pin 7 is coupled to the gate of the gate controlled rectifier 52. The anode of the rectifier 52 is coupled to terminal 24 preferably through resistor 56. Pin 8 is coupled to pin 1 preferably through capacitor 58 and resistor 60. Pin 5 is coupled to terminal 24 preferably through resistor 50.

In a preferred embodiment, the sensor 30 is designed to operate within a temperature range of about −360° F. to about +860° F. Magnetic Metals of Camden, N.J. offers a transformer that operates within this temperature range. (Model No. 5029). Gate controlled rectifier 52 is preferably a silicon controlled rectifier. Varistor 48 is commercially available from Maida of Hampton, Va. (Model No. D73Z0V151RA03UL). In a preferred embodiment the other various circuit components shown in FIG. 3 have the following parameters:

| Component | Parameters |
| --- | --- |
| capacitor 46 | 22 µF, 16 volt |
| capacitor 47 | 0.1 µF, 25 volt |
| resistor 50 | 82 kΩ, ¼ watt |
| capacitor 54 | 0.01 µF, 25 volt |
| resistor 56 | 33 kΩ, ¼ watt |
| capacitor 58 | 0.02 µF, 25 volt |
| resistor 60 | 52 kΩ, ¼ watt |

The present invention is not limited to the particular layout of the circuitry or the particular parameters of the circuit components described herein and shown in FIG. 3.

The operation of the circuitry of the monitor will now be explained. The sensor 30 senses current flow from the power source to the load which, in a preferred embodiment, is at least one heater cable. The amplifier/controller IC 32 detects whether there is current flow and, if so, outputs a trigger signal on pin 7 which is coupled to the gate of the gate controlled rectifier 52. When the gate controlled rectifier 52 receives the trigger signal it becomes conductive and allows current to flow through indicator 20. In a preferred embodiment, the indicator 20 is a light source and current flowing through the indicator 20 illuminates the light source which indicates that current is flowing through the load.

The combination of capacitor 58 and resistor 60 determines the minimum amount of current detectable by the amplifier 32 which, in a preferred embodiment, is about 40 milliamps. The maximum current detectable by the amplifier 32 is about 20 Amps. In a preferred embodiment the current range detectable by the monitor ranges from 40 milliamps to 12 AMPs. The maximum current detectable by the monitor is determined by the circuit components, their arrangement and the gauge of wire used for terminals, for example. The monitor is thus able to detect a wide range of currents. This is particularly important since the load is variable and may include heater cables of various lengths. The amount of current flowing is dependent on the length of the cable coupled to the monitor.

Capacitors 47 and 54 are used as noise suppression filters, capacitor 46 is used to provide AC coupling. Resistor 56 is a load resistor and resistor 50 is used to drop the voltage to pin 5 to a safe level. Varistor 48 is used to provide surge protection.

Figure 5:
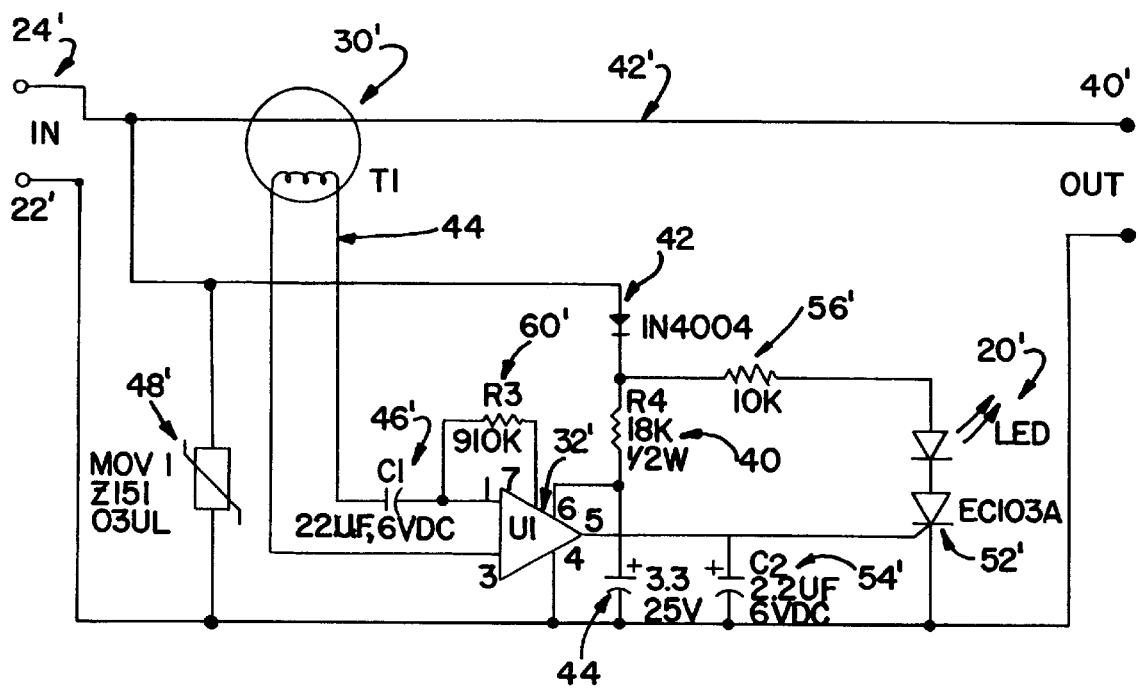
FIG. 5 is a schematic of the circuitry inside the monitors shown in FIGS. 1 and 2 according to another preferred embodiment of the present invention.

FIG. 5 is a schematic of the circuitry inside the monitor shown in FIGS. 1 and 2 according to another preferred embodiment of the present invention. The same reference numerals primed will be used to describe components of the circuitry shown in FIG. 5 that are like those shown in FIG. 3. The circuitry includes a sensor 30', an amplifier/IC controller 32' and an indicator 20'.

Figure 6:
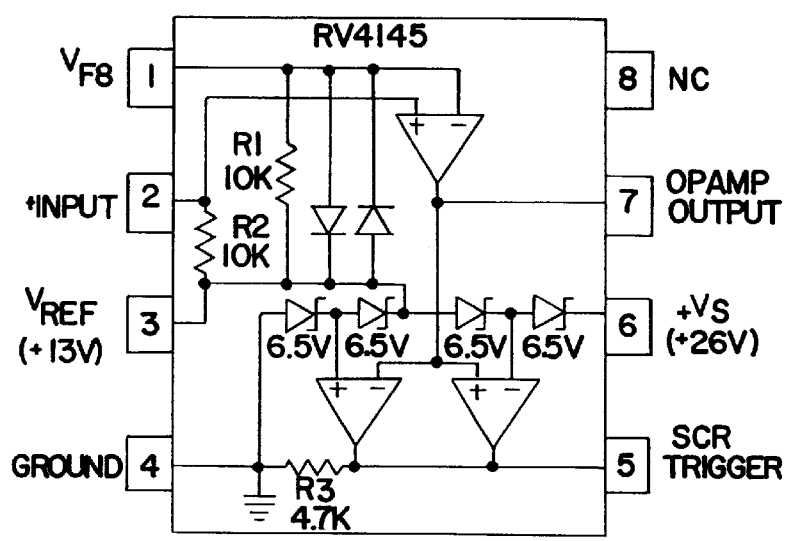
FIG. 6 is a functional block diagram of the amplifier shown in FIG. 5.

The live terminal of a power source (not shown) is coupled to the monitor circuitry at terminal 24' and the neutral terminal of the power source is coupled to the monitor circuitry at terminal 22'. A load (not shown) is coupled to the monitor circuitry at terminal 40'. In a preferred embodiment the amplifier/controller IC 32' is a semiconductor device commercially available as model number RV4145 from the Raytheon Semiconductor Company of Mountain View, Calif. FIG. 6 is a functional block diagram of the amplifier 32' of the monitor circuitry shown in FIG. 5 supplied by Raytheon Semiconductor. The details of the amplifier's circuitry are available from Raytheon Semiconductor and need not be reproduced here.

The sensor 30' in a preferred embodiment is a current transformer having primary and secondary windings 42' and 44' respectively. The primary winding 42' is coupled in series between the power supply and the load. One end of the secondary winding 44' is coupled to pin 3. The other end of the secondary winding 44' is coupled to pin 1 preferably through a capacitor 46'. Pin 4 of the amplifier 32' is coupled to terminal 22. Pin 5 is coupled to terminal 22' through capacitor 54' and is also coupled to the gate of a gate controlled rectifier 52'. Pin 7 is coupled to pin 1 preferably through a resistor 60'. Pin 6 is coupled to terminal 24' through a resistor 40 and diode 42 as shown. The anode of the rectifier 52' is coupled to the indicator 20' which is coupled to load resistor 56'. A capacitor 44 coupler pin 6 to terminal 22'.

In a preferred embodiment, the same sensor 30' as described with reference to FIG. 3 is used. In a preferred embodiment the other various circuit components shown in FIG. 3 have the following parameters:

| Component | Parameters |
|---|---|
| resister 40 | 18 kΩ |
| capacitor 44 | 3.3 µF, 25 volt |
| capacitor 46' | 22 µF, 6 volt |
| capacitor 54' | 2.2 µF, 6 volt |
| resistor 56' | 10 kΩ |
| resistor 60' | 910 kΩ |

The operation of the circuitry of the monitor is similar to that described with reference to FIG. 3 and thus need not be described in greater detail.

While the present invention can be used with heater cables of various lengths, it may also be possible to couple a plurality of heater cables connected in series or parallel to the monitor. In addition, while the monitor 10 is shown in FIG. 1 with plug 12 and socket 13 coupled to the housing 14 of the monitor by cables, the housing 14 may be formed with a plug and socket formed in the housing thereby eliminating the need for cabling.

While the invention has been shown and described in connection with the preferred embodiments, it is apparent that certain changes and modifications, in addition to those mentioned above, may be made from the basic features of the present invention. Accordingly, it is the intention of the applicants to protect all variations and modifications within the true spirit and valid scope of the present invention.

What is claimed is:

1. An apparatus for monitoring the operating condition of at least one heating cable wherein the apparatus is coupled to a power source and the at least one heating cable is coupled to the apparatus, the apparatus comprising:

a current sensor coupled to the at least one heating cable, wherein the current sensor continuously detects that current is flowing from the power source to the heating cable;

an amplifier having an input and an output, wherein the input is coupled to an output of the current sensor, the output of the amplifier provides a first signal when the current sensed by the current sensor ranges from an amperage of less than a milliamp to an amperage of greater than 10 amps and provides a second signal otherwise; and an indicator coupled to the output of the amplifier wherein the indicator provides an indication in response to the first signal output by the amplifier thereby continuously indicating whether current is flowing from the power source to the heating cable.

2. An apparatus according to claim 1 wherein the indicator provides a visual indication in response to the first signal output by the amplifier.

3. An apparatus according to claim 2 wherein the indicator is a light source.

4. An apparatus according to claim 3 wherein the light source is a light emitting diode.

5. An apparatus according to claim 1 wherein the amplifier provides the first signal when the current sensed by the current sensor ranges from 0.04 amps to 12 amps.

6. An apparatus according to claim 1 wherein the current sensor comprises a transformer having primary and secondary windings, the primary winding coupled in series between the power supply and the load and the secondary winding coupled to the input of the amplifier.

7. An apparatus according to claim 6 further comprising a capacitor coupled between the secondary winding and the input to the amplifier.

8. An apparatus according to claim 1 further comprising a gate controlled rectifier coupled between the indicator and the output of the amplifier wherein the output of the amplifier controls the gate of the gate controlled rectifier.

9. An apparatus according to claim 8 wherein the gate controlled rectifier is a silicon controlled rectifier.

10. An apparatus according to claim 1 wherein the indicator is a neon glow lamp.

11. An apparatus according to claim 1 wherein the load is a heater cable.

12. An apparatus for monitoring the operating condition of at least one heating cable wherein the apparatus is coupled to a power source and the at least one heating cable is coupled to the apparatus, the apparatus comprising:

means for continuously detecting current flow in the at least one heating cable; and means for triggering an indicator in response to current flow detected by the means for detecting current flow, wherein the current flow ranges from an amperage less than a milliamp to an amperage greater than 10 amps.

13. An apparatus according to claim 12 wherein the means for detecting current flow is a transformer having a primary winding coupled in series between the power supply and the lead and a secondary winding coupled to the means for triggering.

14. An apparatus according to claim 13 wherein the means for triggering is an amplifier having an input and an output wherein the input is coupled to the secondary winding of the transformer and the output is coupled to the indicator.

15. An apparatus according to claim 1 wherein the current sensor, amplifier and indicator are located in one housing wherein the housing has a plug for coupling the power source to the housing and a socket for coupling a heater cable to the housing.

16. An apparatus according to claim 15 wherein the housing is formed of plastic.

17. An apparatus according to claim 16 wherein the plastic is transparent.

* * * * *